United States Patent [19]

Donoghue et al.

[11] 4,451,907
[45] May 29, 1984

[54] PULL-UP CIRCUIT FOR A MEMORY

[75] Inventors: William J. Donoghue, Round Rock; Rodney C. Tesch, Austin, both of Tex.

[73] Assignee: Motorola, Inc., Schaumburg, Ill.

[21] Appl. No.: 314,816

[22] Filed: Oct. 26, 1981

[51] Int. Cl.³ .............................................. G11C 7/00
[52] U.S. Cl. .................................... 365/203; 365/190
[58] Field of Search ............... 365/174, 181, 190, 202, 365/203, 204, 205, 149

[56] References Cited

U.S. PATENT DOCUMENTS 3,936,810  2/1976  Dunn .................................. 365/190
4,291,392  9/1981  Proebsting ......................... 365/203

Primary Examiner—Joseph A. Popek
Attorney, Agent, or Firm—James L. Clingan, Jr.

[57] ABSTRACT

A pull-up circuit for a memory provides an additional natural transistor between a power supply and diode-connected transistors which reduces the voltage on bit sense lines sufficiently to allow selected column select transistors to turn on prior to a memory cell being enabled. Additional control circuitry further reduces the voltage to the diode-connected transistors when no memory cells have been selected to be enabled to compensate for the reduction in voltage drop across the natural transistor when no current is flowing through it.

9 Claims, 2 Drawing Figures

- *PRIOR ART* -

4,451,907

PULL-UP CIRCUIT FOR A MEMORY

TECHNICAL FIELD

The invention relates to pull-up circuits, and more particularly to column pull-up circuits for static random access memories (static RAMs).

BACKGROUND ART

A typical enabled memory cell in a static RAM provides both a true and a complementary output signal on a pair of bit sense lines. The bit sense lines are coupled by column select transistors to a sense amplifier which is a high gain differential aplifier for detecting the state of the enabled memory cell. In the closest known prior art, shown in FIG. 1, there is an undesirable delay in coupling the bit sense lines to the sense amplifier. Operation of the prior art circuit shown in FIG. 1 is subsequently described in the description of a preferred embodiment.

BRIEF SUMMARY OF THE INVENTION

An object of the present invention is to provide an improved pull-up circuit.

Another object is to reduce the delay in coupling a bit sense line to a sense amplifier, and more particularly to reduce said delay without complicating column decoders.

Yet another object of the invention is to reduce a voltage level on bit sense lines.

The above and other objects and advantages of the present invention are achieved by a column pull-up circuit which provides a reduced voltage level to a pair of bit sense lines of a column of memory cells. A natural transistor is connected between a positive power supply and a prior art bit sense line configuration to achieve the reduced voltage level on the pair of bit sense lines. A pull-up control signal is provided to a gate of the natural transistor by a pull-up control circuit. The pull-up signal is supplied at a first predetermined voltage level when a control signal is at a first logic state and a second predetermined voltage when the control signal is at a second logic state.

DESCRIPTION OF A PREFERRED EMBODIMENT

Figure 1:
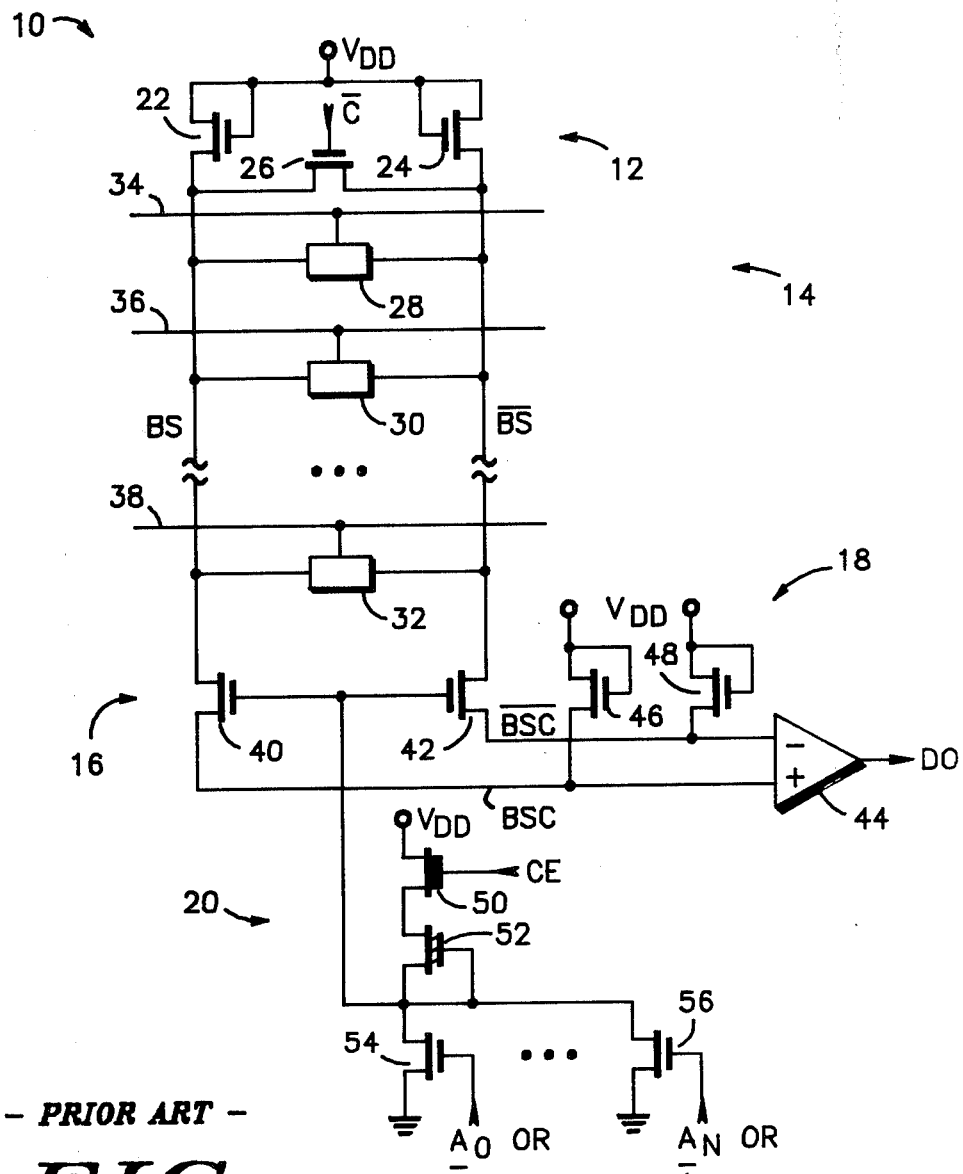
FIG. 1 is a circuit diagram of a column of memory elements with a pull-up circuit of the prior art.
Figure 2:
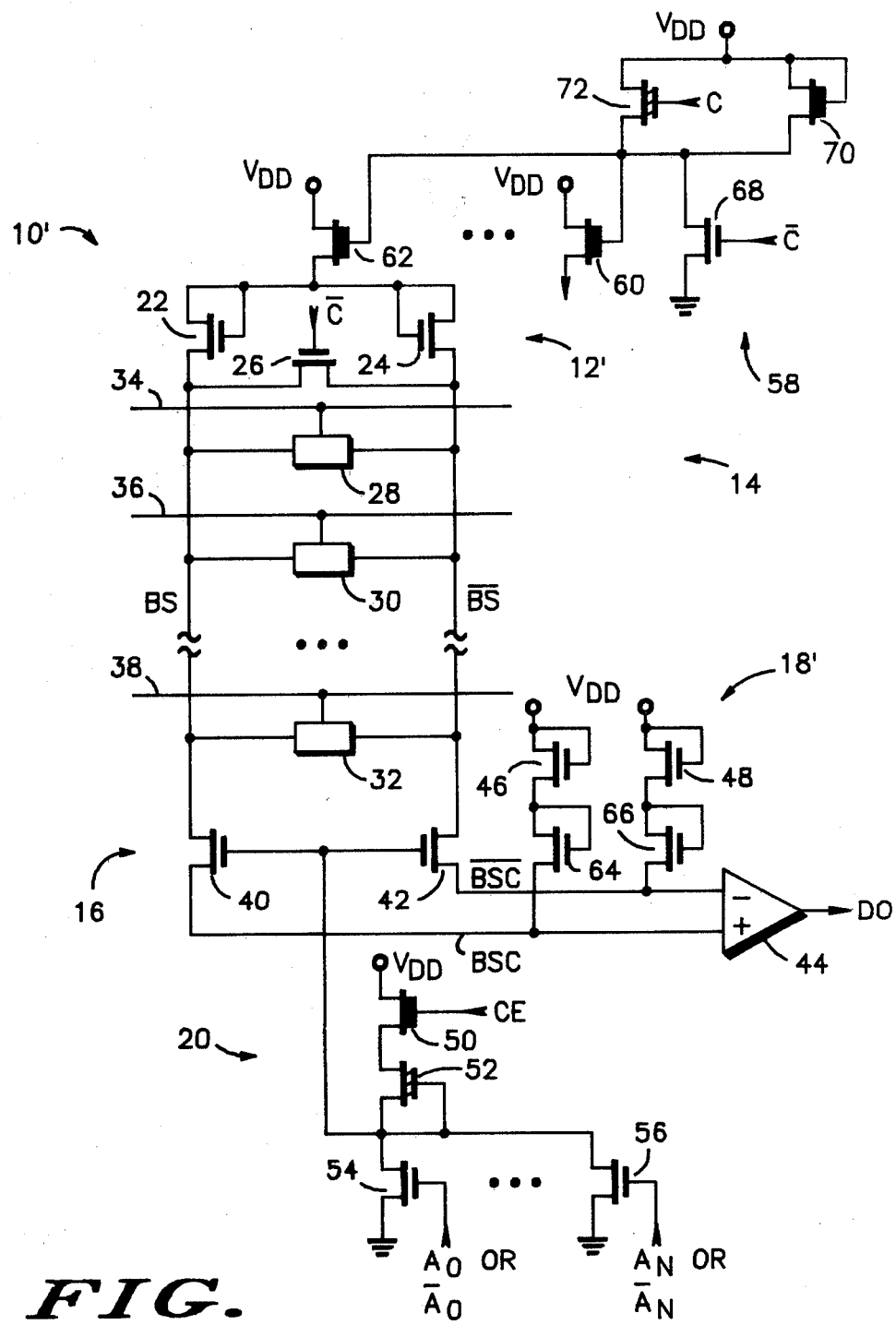
FIG. 2 is a circuit diagram of a column of memory elements with a pull-up circuit according to a preferred embodiment of the present invention.

Shown in FIG. 1 is a typical column of memory elements 10 of an integrated circuit memory of the prior art comprised generally of a pull-up circuit 12, a bit sense line section 14, a column select circuit 16, a sense amplifier circuit 18, and a column decoder circuit 20. Both the prior art shown in FIG. 1 and a preferred embodiment shown in FIG. 2 are depicted using N channel insulated gate field effect transistors of three types: natural transistors, enhancement transistors, and depletion transistors. The natural transistors have a characteristic threshold voltage of 0 to 0.2 volts, the enhancement transistors have a characteristic threshold voltage of 0.4 to 0.7 volts, and the depletion transistors have a characteristic threshold voltage of $-3$ to $-4$ volts.

The pull-up circuit 12 comprises two diode-connected enhancement transistors 22 and 24. Transistor 22 has a gate and drain connected to a positive power supply terminal $V_{DD}$, and a source connected to a bit sense line BS. Transistor 24 has a gate and drain connected to $V_{DD}$, and source connected to a complementary bit sense line $\overline{BS}$.

The bit sense section 14 comprises an enhancement transistor 26, the bit sense lines BS and $\overline{BS}$, a plurality of memory elements, and a plurality of row lines. Shown are memory elements 28, 30 and 32 connected to respective row lines 34, 36 and 38. It will be recognized that a memory column will have more memory elements than those illustrated. Each memory element has an input connected to its respective row line, a true output connected to bit sense line BS, and a complementary output connected to bit sense line $\overline{BS}$. Transistor 26 has a first electrode connected to bit sense line BS, a second electrode connected to bit sense line $\overline{BS}$, and a gate connected to a select control signal C. Because transistor 26 is for balancing the bit sense lines, the function of an electrode as a source or drain will vary.

The column select circuit 16 comprises two enhancement transistors 40 and 42. Each column select transistor has a corresponding bit sense line and bit sense common line. Column select transistor 40 has a source connected to bit sense line BS, a gate connected to an output of column decoder circuit 20, and a drain connected to a bit sense common line BSC. Column select transistor 42 has a source connected to bit sense line $\overline{BS}$, a gate connected to the output of column decoder 20, and a drain connected to a bit sense common line $\overline{BSC}$. Accordingly, transistor 40 corresponds to bit sense line BS and bit sense common line BSC, whereas transistor 42 corresponds to bit sense line $\overline{BS}$ and bit sense common line $\overline{BSC}$.

Sense amplifier circuit 18 comprises the bit sense lines BSC and $\overline{BSC}$, a high gain differential amplifier 44, and enhancement transistors 46 and 48. Amplifier 44 has a non-inverting input connected to bit sense common line BSC, an inverting input connected to bit sense common line $\overline{BSC}$, and an output which provides a data output signal DO. Transistor 46 is diode-connected to form a load for bit sense line BSC. Transistor 48 is diode-connected to form a load for bit sense line $\overline{BSC}$. Transistor 46 has a gate and drain connected to $V_{DD}$, and a source connected to bit sense line BSC. Transistor 48 has a gate and drain connected to $V_{DD}$, and a source connected to bit sense line $\overline{BSC}$.

Column decoder 20 comprises load transistors 50 and 52, and a plurality of decoder transistors. Transistor 50 is a natural transistor having a gate connected to a chip enable signal CE, a drain connected to $V_{DD}$, and a source. Transistor 52 is a depletion transistor having a drain connected to the source of transistor 50, and gate and source connected to an output node which is where the output of the column decoder circuit 10 is provided. Enhancement transistors 54 and 56 are shown as representative of the plurality of decoder transistors. Each decoder transistor has a gate connected to an address signal $A_0$–$A_N$ or $\overline{A_0}$–$\overline{A_N}$, a source connected to a negative power supply terminal shown as ground, and a drain connected to the output node. Chip enable signal CE is a logic high, at the positive power supply voltage, when column decoder circuit 20 is operational, and a logic low to conserve power in standby mode. When column decoder circuit 20 is operational, which is the case hereinafter assumed, transistor 50 is effectively diode-connected.

One of the plurality of memory elements is enabled when a signal is present on its respective row line. An enabled memory element causes one of the bit sense lines BS or $\overline{BS}$ to be reduced in voltage while keeping the other bit sense line at a higher voltage level. When none of the memory elements are selected to be enabled, select control signal $\overline{C}$ is a logic high in order to turn on transistor 26 for balancing the voltage levels of the bit sense lines BS and $\overline{BS}$. The select control signal $\overline{C}$ is a logic low when one of the plurality of memory cells is to be enabled.

The column of memory elements 10 is selected when all address signals $A_0-A_N$ or $\overline{A_0}-\overline{A_N}$ received by column decoder circuit 20 are low. The column decoder circuit 20 then provides a logic high output to the gates of the column select transistors 40 and 42. An enabled memory element brings one of bit sense lines BS or $\overline{BS}$ low which causes the corresponding column select transistor to turn on. The low bit sense line is thereby coupled to the corresponding bit sense common line as an input to the differential amplifier 44 which then provides the data output signal DO.

Prior to a memory element being enabled, both bit sense lines BS and $\overline{BS}$ and both bit sense common lines BSC and $\overline{BSC}$ are pulled up by diode-connected enhancement transistors to the positive power supply voltage less one enhancement threshold voltage. The logic high output of the column decoder circuit 20 is somewhat less than the positive power supply voltage, primarily because of the voltage drop across natural transistor 50. Natural transistor 50 will have a somewhat increased threshold voltage due to body effect, the effect of a positive source to substrate voltage, which is well known in the art. With the sources of column select transistors 40 and 42 at only one enhancement threshold voltage below the positive power supply voltage, the logic high output of column decoder circuit 20, at one natural threshold voltage below the positive power supply voltage, is not sufficient to turn on the column select transistors 40 and 42. Consequently, not until a memory element is enabled, bringing one of bit sense lines VS or $\overline{BS}$ low, will the corresponding column select transistor be turned on. There is a delay time associated with turning on the column select transistor which causes a delay in being able to sense the output of the enabled memory cell. This type of time delay may be less than 10 nanoseconds, but such time delay is very significant in a 40 nanosecond or less read cycle, typical of modern memory circuits. One method of turning on column select transistors 40 and 42 is to provide a bootstrap circuit to bring the output of the column decoder circuit to a higher voltage. Such circuits are relatively large in chip area and one such circuit would be required for each column of memory elements.

Shown in FIG. 2 is the preferred embodiment of the invention as an improved column of memory cells 10' comprised generally of an improved pull-up circuit 12', bit sense line section 14 of FIG. 1, column select circuit 16 of FIG. 1, a modified sense amplifier circuit 18', column decoder circuit 20 of FIG. 1, and pull-up control circuit 58. Also shown is a secondary pull-up transistor 60 for illustrating that pull-up control circuit 58 can control a plurality of improved pull-up circuits. Improved pull-up circuit 12', bit sense line section 14, column select circuit 16, modified sense amplifier circuit 18', and column decoder circuit 20, all of FIG. 2, are interconnected in the same way as pull-up circuit 12, bit sense line section 14, column select circuit 16, sense amplifier circuit 18, and column decoder circuit 20 are interconnected as shown in FIG. 1.

Improved pull-up circuit 12' is the same as pull-up circuit 12 of FIG. 1 except a natural transistor 62 is interposed between $V_{DD}$ and the gates and drains of transistors 22 and 24. Transistor 62 has a drain connected to $V_{DD}$, a source connected to the gates and drains of transistors 22 and 24, and a gate connected to an output of pull-up control circuit 58.

Modified sense amplifier circuit 18' is the same as sense amplifier circuit 18 of FIG. 1 except two diode-connected enhancement transistors 64 and 66 have been interposed between bit sense common line BSC and transistor 46 and between bit common sense line $\overline{BSC}$ and transistor 48, respectively. Transistor 64 has a gate and drain connected to the source of transistor 46, and a source connected to bit sense common line BSC. Transistor 66 has a gate and drain connected to the source of transistor 48, and a source connected to bit sense common line $\overline{BSC}$.

Pull-up control circuit 58 comprises an enhancement transistor 68, a natural transistor 70, and a depletion transistor 72. Transistor 68 has a source connected to ground, a gate connected to select control signal $\overline{C}$, and a drain connected to an output node of pull-up circuit 58 which is where the output of pull-up circuit 58 is provided. Transistor 70 has a gate and a drain connected to $V_{DD}$ and a source connected to the output node of pullup circuit 58. Transistor 72 has a drain connected to $V_{DD}$, a source connected to the output node of pull-up circuit 58, and a gate connected to select control signal C, the complement of $\overline{C}$. Select control signal C is logic high when a memory element is to be enabled and logic low when none of the memory elements are selected to be enabled.

When select control signal C is logic low and $\overline{C}$ is logic high, transistor 72 is off and transistor 68 is on. Transistor 68 has a much smaller channel width to channel length ratio than does transistor 70. Transistor 68 pulls just enough current to ensure that diode-connected natural transistor 70 will cause the output of pull-up control circuit 58 to be a natural threshold voltage below the positive power supply voltage. The body effect ensures a positive threshold voltage, in the order of 0.2 volt, for natural transistor 70. Transistor 62, with a natural threshold voltage below the positive power supply voltage on its gate, provides a voltage to the gates and drains of diode-connected transistors 22 and 24 which is two natural threshold voltages below the positive power supply. Consequently, the voltage level on bit sense lines BS and $\overline{BS}$ is two natural threshold voltages and one enhancement threshold voltage below the positive power supply voltage.

When select control signal C is logic high and $\overline{C}$ is logic low, transistor 72 is on and transistor 68 is off. In this on condition, transistor 72 causes essentially no voltage drop so that the output of the pull-up circuit is essentially the positive power supply voltage. With the positive power supply voltage on its gate, transistor 62 responds like a diode-connected natural transistor. Transistor 62 will have a natural threshold voltage drop plus some additional voltage drop due to current being pulled by an enabled memory cell. The additional voltage drop is at least as much as a natural threshold voltage. Consequently the gates and drains of transistors 22 and 24 will be at or lower than two natural threshold voltages below the positive power supply regardless of the logic state of select control signal C. There is a small time period after control signal C goes high and before a memory cell is enabled during which pull-up control circuit 58 provides the positive supply voltage as its output and no current is drawn through transistor 62. This situation would appear to cause transistor 62 to drop only one natural threshold voltage. The voltage on the gates and drains of transistors 22 and 24, however, will not change during this small time period because of a time delay in transistor 62 receiving the output of pull-up control circuit 58 and because of capacitance associated with bit sense lines BS and $\overline{BS}$.

Because the voltage level on the gates and drains of diode-connected transistors 22 and 24 is at two natural threshold voltages below the positive power supply voltage, the bit sense lines BS and $\overline{BS}$ will be at two natural threshold voltages plus an enhancement threshold voltage below the positive power supply voltage. Consequently, the logic high output of column decoder 20 of a natural threshold voltage below the positive power supply is sufficient to provide a gate to source bias voltage on column select transistors 40 and 42 which is sufficient for the column select transistors 40 and 42 to turn on before an enabled memory cell brings one of the bit sense lines BS or $\overline{BS}$ low. There is, therefore, no turn on delay associated with the column select transistors 40 and 42. Because bit sense lines BS and $\overline{BS}$ are at a reduced voltage, it is necessary to also reduce the voltage on the bit sense common lines BSC and $\overline{BSC}$. Diode-connected transistors 64 and 66 were inserted for this purpose. In the time period between the logic high output of column decoder 20 being provided and a memory cell being enabled, bit sense common lines BSC and $\overline{BSC}$ are brought to the same voltage level as on the bit sense lines BS and $\overline{BS}$ via column select transistors 40 and 42. If there was only one diode-connected transistor between $V_{DD}$ and bit sense common lines BSC and $\overline{BSC}$, the bit sense common lines BSC and $\overline{BSC}$ would not be matched in voltage level with bit sense lines BS and $\overline{BS}$ prior to a memory cell being enabled. A benefit though is that recovery time following an input from a memory cell is shorter because bit sense lines BSC and $\overline{BSC}$ are charged to a lower voltage.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. A memory circuit comprising:
a conductor;
a plurality of memory cells, each memory cell coupled to said conductor;
enabling means for enabling one of said memory cells;
a diode-connected transistor coupled between said conductor and a common node;
a pull-up transistor having a control electrode coupled to a pull-up signal, a first electrode coupled to the common node, and a second electrode coupled to a first power supply terminal; and
pull-up means for providing the pull-up signal at a first predetermined voltage level when a control signal is at a first logic state, and for providing the pull-up signal at a second predetermined voltage level when the control signal is at a second logic state.

2. A column pull-up circuit comprising:
first and second bit sense-lines;
a plurality of memory cells, each memory cell coupled to both bit sense lines;
row decoder means for enabling one of said memory cells in response to a row address signal;
a first diode-connected transistor coupled between the first bit sense line and a common node;
a second diode-connected transistor coupled between the second bit sense line and the common node;
a pull-up transistor having a control electrode coupled to a pull-up node, a first electrode coupled to the common node, and a second electrode coupled to a power supply terminal; and
pull-up means for providing a pull-up signal at a first voltage level to the pull-up node when a control signal is at a first logic state, and for providing the pull-up signal at a voltage level higher than said first voltage level when the control signal is at a second logic state.

3. The memory circuit of claim 1 or 2 wherein the pull-up transistor is a natural transistor.

4. The memory circuit of claim 3 wherein the pull-up means comprises:
a first transistor having a first electrode coupled to a second power supply terminal, a gate coupled to a complement of the control signal, and a second electrode coupled to an output node which is where the pull-up signal is provided;
a second transistor having a control electrode and a first electrode coupled to the first power supply terminal, and a second electrode coupled to the output node; and
a third transistor having a control electrode coupled to the control signal, a first electrode coupled to the output node, and a second electrode coupled to the first power supply terminal.

5. The memory circuit of claim 4 wherein the first transistor is an enhancement transistor, the second transistor is a natural transistor, and the third transistor is a depletion transistor.

6. A memory circuit comprising:
a column conductor;
a plurality of memory cells, each memory cell coupled to said column conductor;
a diode-connected transistor coupled between the column conductor and a supply node;
a pull-up transistor coupled between the supply node and a first power supply terminal;
a bit sense common line;
a coupling transistor having a first current electrode coupled to the bit sense common line, a second current electrode coupled to the column conductor, and a control electrode for receiving a decoder signal; and
a column decoder having an output for providing the decoder signal to the control electrode of the coupling transistor in response to a predetermined address and a chip enable signal, wherein said column decoder has a chip enable transistor which is coupled between the output and the first power supply terminal and which is activated in response to the chip enable signal for enabling the column decoder to provide the decoder signal in response to the predetermined address.

7. The memory circuit of claim 6 further comprising:
pull-up means for providing a pull-up signal at a first predetermined voltage level when a control signal is at a first logic state, and for providing the pull-up signal at a second predetermined voltage level when the control signal is at a second logic state; and wherein the pull-up transistor has a first current electrode coupled to the supply node, a second current electrode coupled to the first power supply terminal, and a control electrode for receiving the pull-up signal.

8. The memory circuit of claim 7 wherein the pull-up means comprises:

a first transistor having a first electrode coupled to a second power supply terminal, a gate coupled to a complement of the control signal, and a second electrode coupled to an output node for providing the pull-up signal to the control electrode of the pull-up transistor;

a second transistor having a control electrode and a first electrode coupled to the first power supply terminal, and a second electrode coupled to the output node; and a third transistor having a control electrode coupled to the control signal, a first electrode coupled to the output node, and a second electrode coupled to the first power supply terminal.

9. The memory circuit of claim 6 wherein the coupling and diode-connected transistors are enhancement transistors and the chip enable and pull-up transistors are natural transistors.

* * * * *